(12) United States Patent
Goldin

(10) Patent No.: US 7,547,991 B2
(45) Date of Patent: Jun. 16, 2009

(54) REDUNDANCY POWER FOR COMMUNICATION DEVICES

(75) Inventor: Leonid Goldin, Ottawa (CA)

(73) Assignee: Cisco Technology, Inc., San Jose, CA (US)

( * ) Notice: Subject to any disclaimer, the term of this patent is extended or adjusted under 35 U.S.C. 154(b) by 628 days.

(21) Appl. No.: 11/184,293

(22) Filed: Jul. 18, 2005

(65) Prior Publication Data

US 2007/0014166 A1    Jan. 18, 2007

(51) Int. Cl.
*H02J 1/00* (2006.01)
(52) U.S. Cl. .................... 307/85; 307/130; 710/306
(58) Field of Classification Search ............. 307/85, 307/130; 713/300, 340; 702/57; 710/306; 323/265
See application file for complete search history.

(56) References Cited

U.S. PATENT DOCUMENTS

| 5,596,569 | A | 1/1997 | Madonna et al. | 370/217 |
| 6,031,362 | A | * 2/2000 | Bradley | 323/269 |
| 6,150,736 | A | 11/2000 | Brill | 307/64 |
| 2004/0164708 | A1* | 8/2004 | Veselic et al. | 320/132 |
| 2005/0194839 | A1* | 9/2005 | Amerom et al. | 307/82 |

FOREIGN PATENT DOCUMENTS

JP    05122873 A  *  5/1993

* cited by examiner

*Primary Examiner*—Albert W Paladini
*Assistant Examiner*—Daniel Cavallari
(74) *Attorney, Agent, or Firm*—Stolowitz Ford Cowger LLP

(57) ABSTRACT

A system and method to provide redundant power to a failing line in a communication device within a communication network supporting the transmission and reception of data. Through the use of a common Y-Cable connector, a power switch is provided to provide power between an active line and a standby line to maintain a high impedance state should one line fail.

9 Claims, 5 Drawing Sheets

Background

REDUNDANCY POWER FOR COMMUNICATION DEVICES

BACKGROUND OF THE INVENTION

In transmitting and receiving data between communications devices in a computer network, reliability is crucial. In order to ensure reliability, circuits that transmit and receive data are often redundant. If an active line goes down a standby line will take over. There are three main models for providing redundant circuits. A description of each follows.

A 1+1 redundancy configuration provides two circuits working in parallel and carrying the same data through two separate physical links. If one interface fails the other takes over. This configuration is the most robust and also the most expensive as it has redundancy not just in the hardware but also for the physical links carrying the data.

A 1:1 redundancy configuration has a device such as an active interface card and one standby card configured in the same manner. As soon as the active interface fails a switch is made to the standby card. The failed card can then be replaced without impacting the data traffic. Typical implementation of such a solution utilizes relays to switch from one interface card to another.

A 1:N redundancy configuration protects N interfaces with a single redundant standby. As soon as one interface fails, the redundant standby takes over. If during this time a second interface fails, then it is not protected. This configuration has a low cost and is often used for a small number of communication lines. The major drawback to this configuration is that a special protection bus is required in hardware to connect the redundant interface to the active interfaces.

The present invention provides a simple and efficient system for implementing 1:1 redundancy in communications devices.

BRIEF DESCRIPTION OF THE DRAWINGS

For a better understanding of the present invention, and to show more clearly how it may be carried into effect, reference will now be made, by way of example, to the accompanying drawings which aid in understanding an embodiment of the present invention and in which.

DETAILED DESCRIPTION OF EMBODIMENTS OF THE INVENTION

Figure 1:
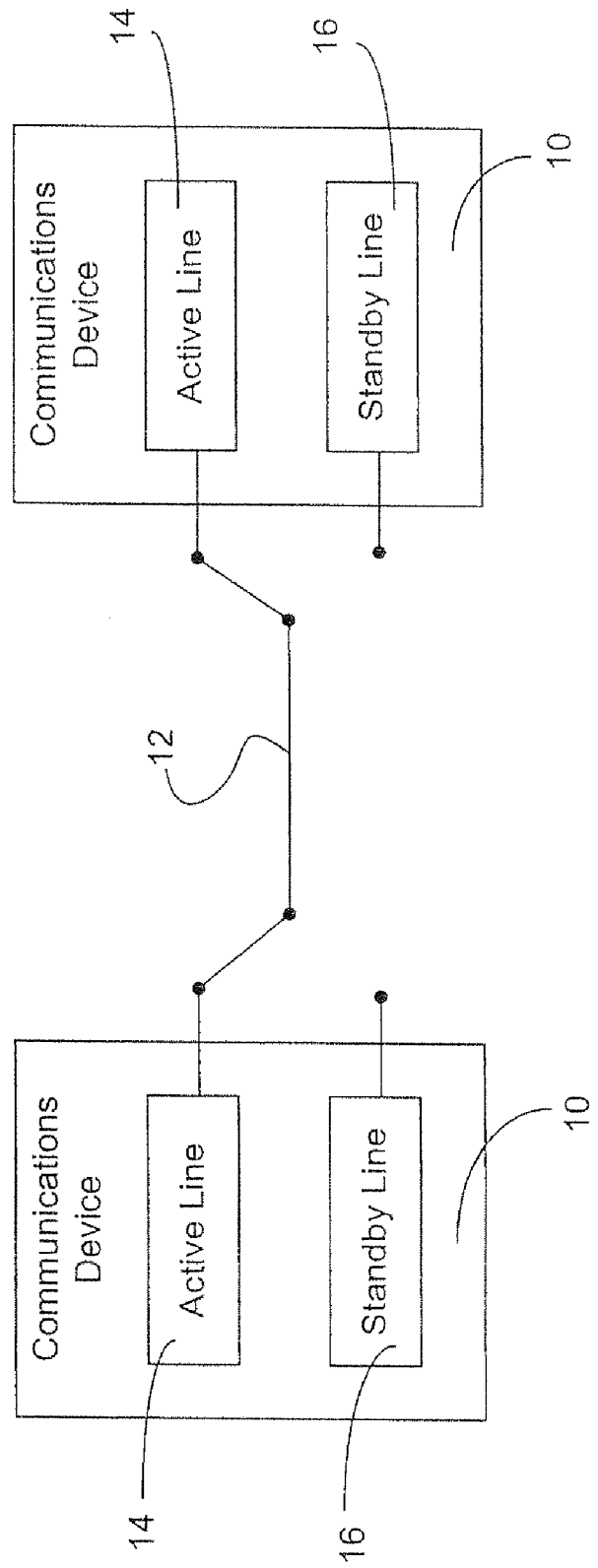
FIG. 1 is a block diagram illustrating connections between two communications devices.

Before describing the present invention in detail we will first discuss the problem to be solved and some prior art solutions. Beginning with FIG. 1 two communication devices 10 are shown connected to each other by a communications line 12. Active line circuitry 14 provides protection for voltage surges on line 12 as well as transmitting and receiving data on line 12. Should line 12 fail for any number of problems, for example a faulty Line Interface Unit (LIU), then communication device 10 having a failure, switches to standby line circuitry 16 to maintain the use of line 12.

Figure 2:
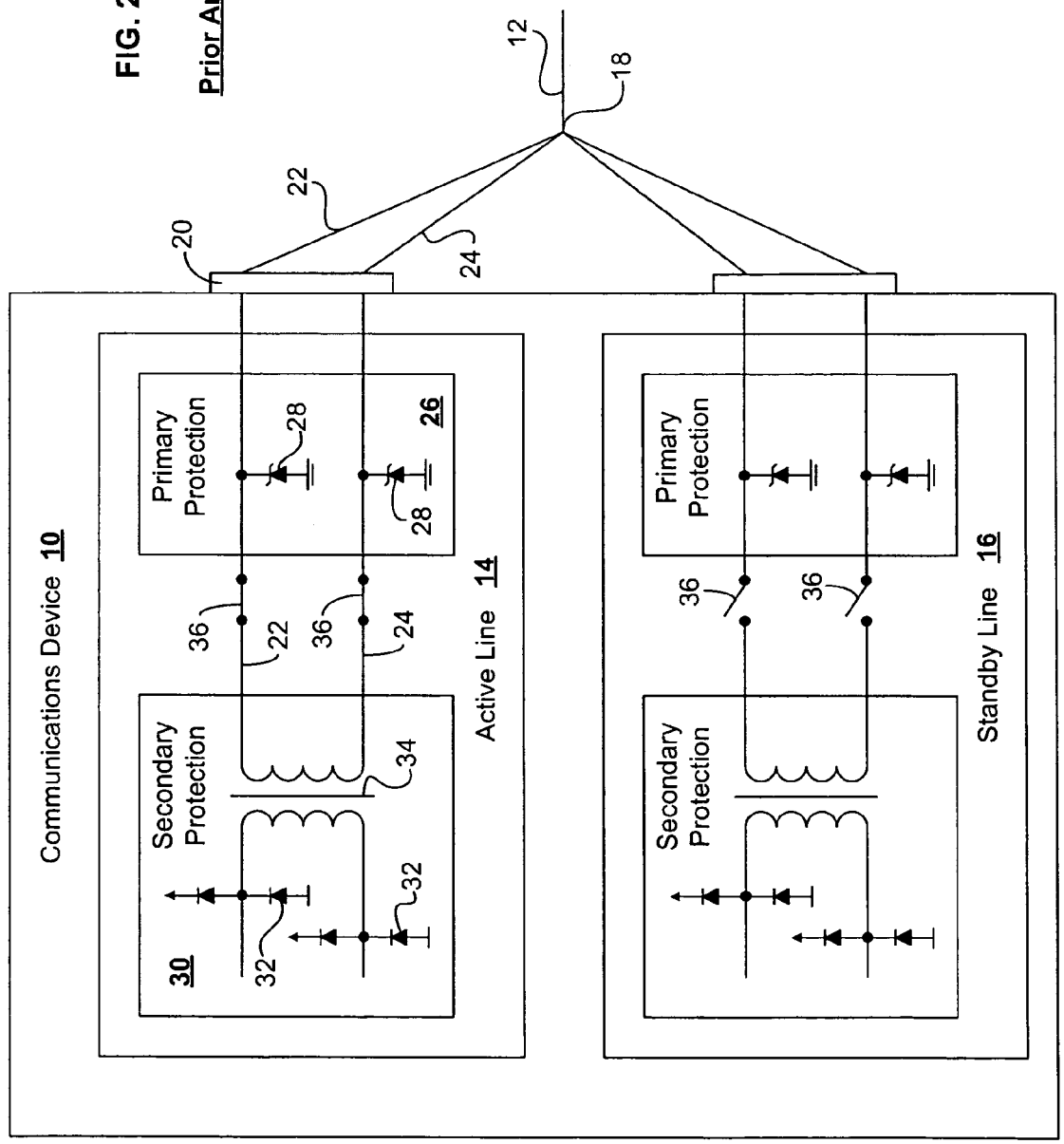
FIG. 2 is a block diagram illustrating a prior art first embodiment of protection circuits within a communications device.

FIG. 2 is a block diagram illustrating a prior art first embodiment of protection circuits within a communications device. As discussed with regard to FIG. 1, communications device 10 comprises an active line 14 and a standby line 16. In the embodiment as illustrated active line 14 and standby line 16 are implemented as separate communications cards within communications device 10, being connected directly by a Y-cable 18.

The configuration for active line 14 and standby line 16 is identical. Communications line 12 connects to active line 14 and standby line 16 via Y-cable 18. Y-cable 18 connects to connector 20. Connector 20 accepts two lines from Y-cable 18, the first being a "tip" 22 and the second being a ring "24". This terminology is a legacy from the use of BNC connectors (a ringed connector) where the tip was the positive side of the line and the ring was for the ground. The connection through tip 22 and ring 24 traverse through active line 14 as shown. The configuration of active line 14 is identical to that of standby line 16.

Should a surge occur on either of tip 22 or ring 24, primary protection 26 utilizes zenor diodes 28 or any other type of voltage suppression device to reduce the amount of voltage. The excess voltage is discharged to the power supply of communications device 10 or ground rails. The reduced voltage is then passed to secondary protection 30 which makes use of a second set of diodes 32 to further reduce the voltage to ensure no damage occurs to the circuitry of active line 14. A transformer 34 serves as an AC coupling between the circuitry on active line 14.

There are relays 36 on the lines for both tip 22 and ring 24. In the example as shown the relays 36 are closed in active line 14. Conversely, relays 36 in standby line 16 are open indicating that standby line 16 is not active. Should a controller, be it hardware or software, detect a failure in the circuitry of active line 14, it will open the relays 36 in active line 14 and close the relays 36 in standby line 16 so that the connection to communications line 12 is not broken.

The use of relays 36 for many communications devices 10 is not viable as they are bulky, relatively expensive, and often too slow and utilize more power than other alternatives.

Figure 3:
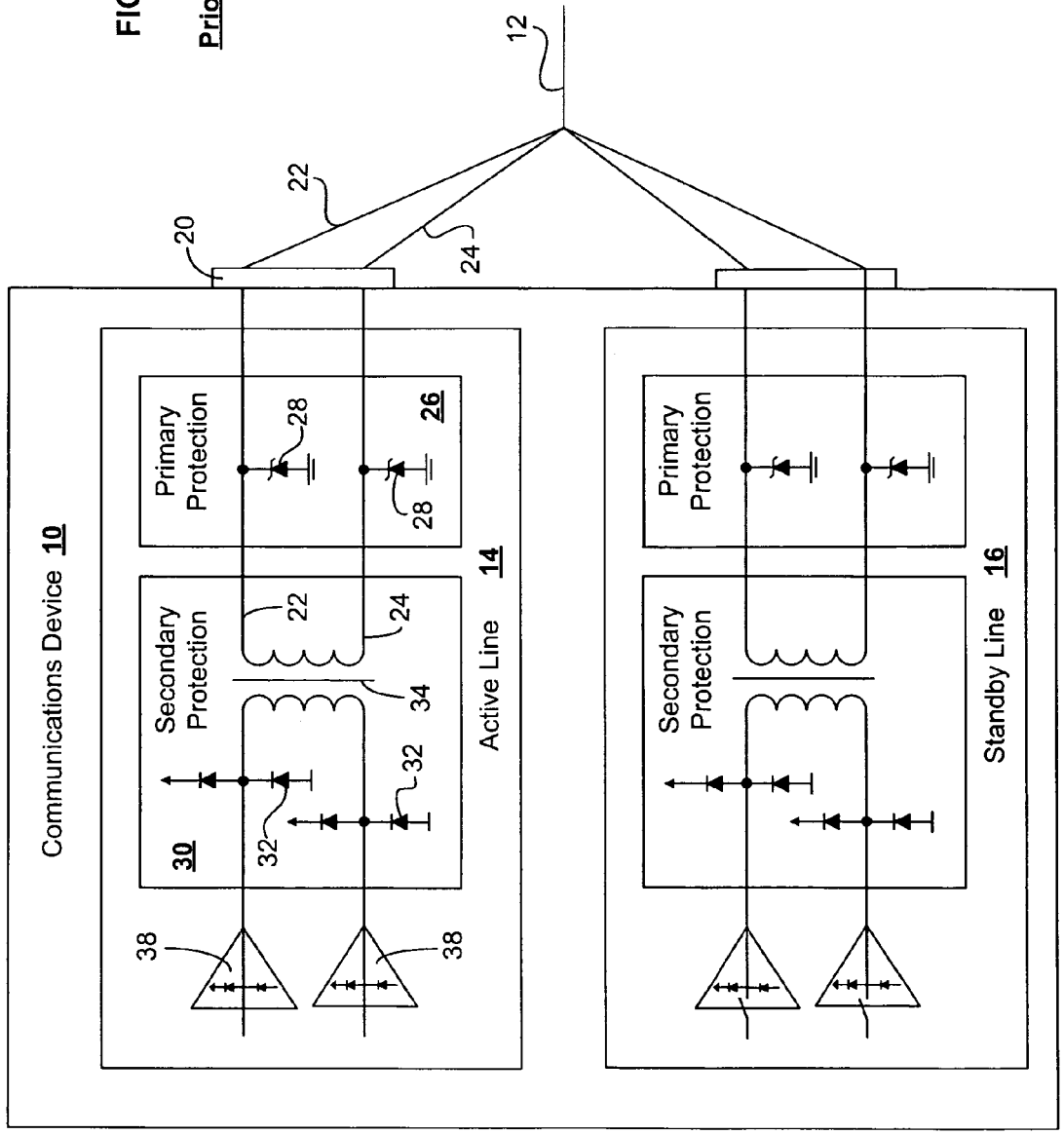
FIG. 3 is a block diagram illustrating a prior art second embodiment of protection circuits within a communications device.

We now refer to FIG. 3, a block diagram illustrating a prior art second embodiment of protection circuits within a communications device. The embodiment of FIG. 3 differs from that of FIG. 2 in that relays 36 have been replaced with Line Interface Units (LIU's) in the form of tristate outputs 38. As with FIG. 2 the architecture of active line 14 and standby line 16 are identical. Should a failure occur, tristate outputs 38 will be instructed to open to disable communications for active line 14 and the tristate outputs 38 of standby line 16 will be closed to utilize standby line 16.

The problem with LIU's as tristate outputs 38 is that they require clamping diodes on output, which results in low impedance in the case of power loss. This low impedance impairs the mandatory signal shape required by telecommunication standards such as ITU G.283 and G.824. The same impairment will be produced by the diodes of the mandatory secondary protection 30. Should a power loss occur, in order to keep the Input/Output function of a standby line 16 in high impedance, auxiliary power is required. The present invention provides this auxiliary power through Y-cable 18, which is always, connected to active line 14 and standby line 16. Such a solution avoids the need for common power from a backplane.

Figure 4:
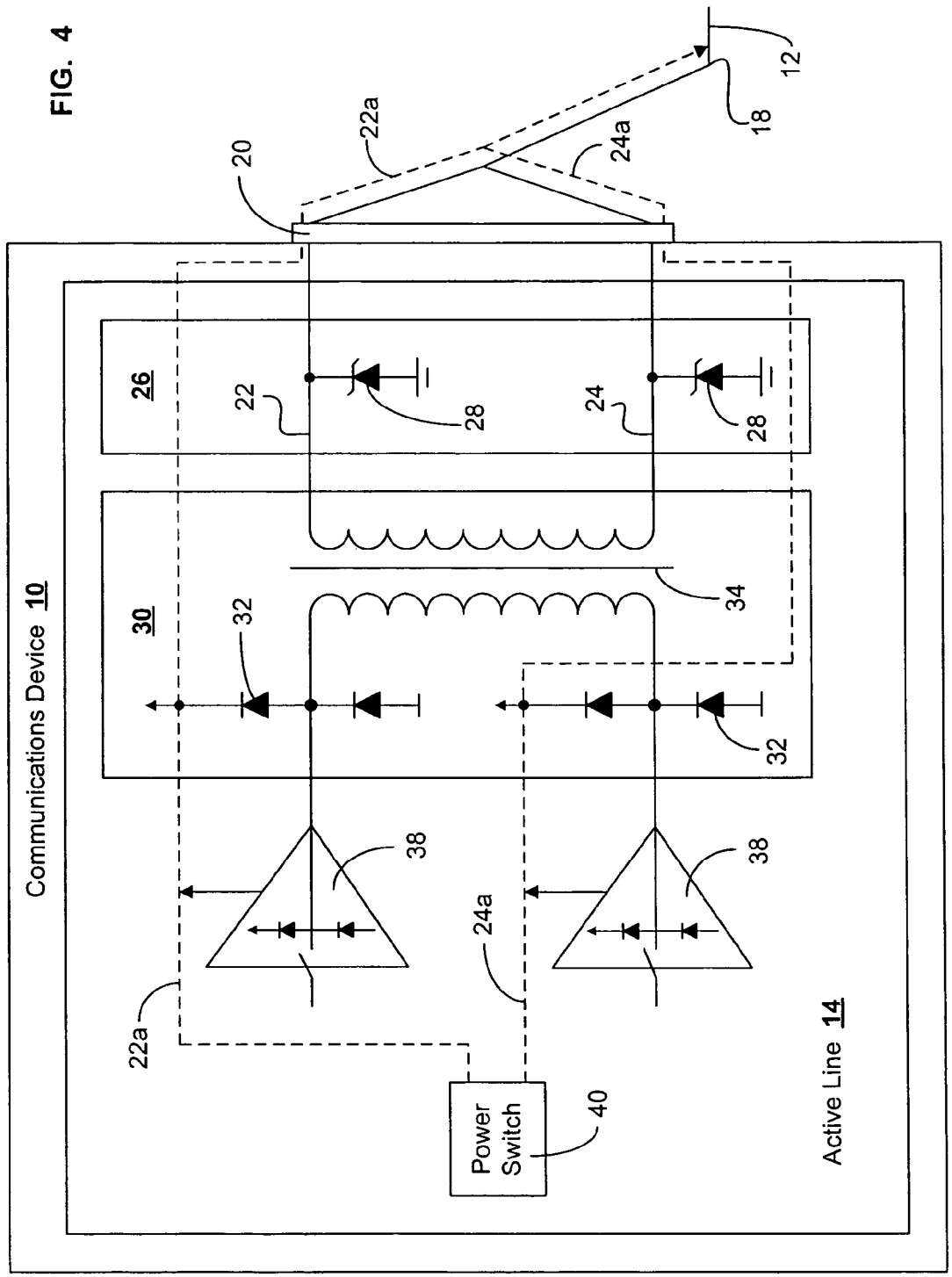
FIG. 4 is a block diagram illustrating the use of a power switch within a communications device.

Referring now to FIG. 4 a block diagram illustrating the use of a power switch within a communications device is shown.

FIG. 4 illustrates the same structure for active line 14 of FIG. 3 save for the addition of power switch 40. The identical structure of FIG. 4 would be mirrored in standby line 16. Upon detection of a power loss power switch 40 is activated to provide power to the failed line. Power switch 40 directs power to the failed line from its power supply. A small amount of current is provided via the shared connections provided by Y-cable 18 between active line 14 and standby line 16 as shown in dashed lines 22a and 24a. Enough power is provided to maintain the output and input of the failing line in a high impedance state.

Figure 5:
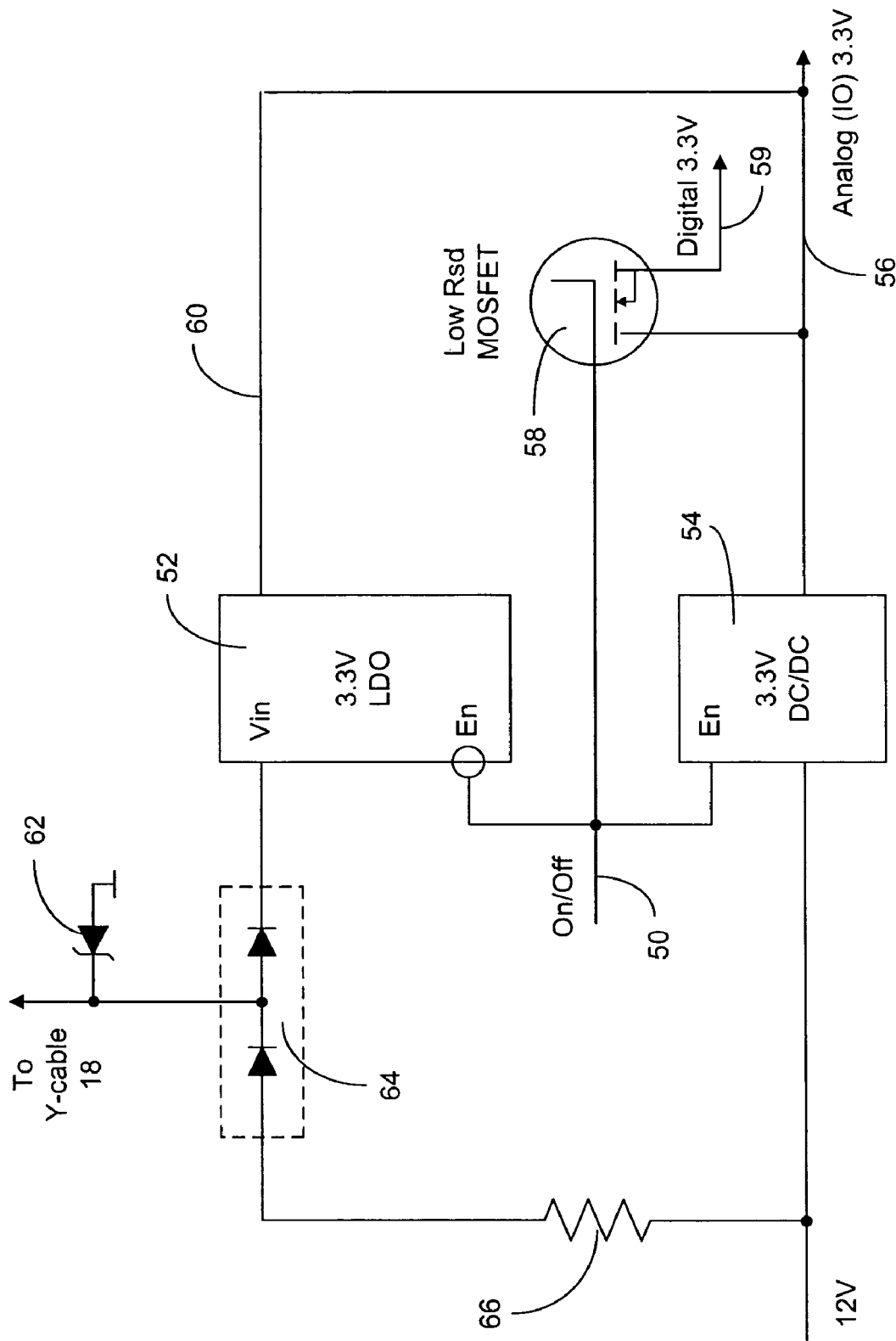
FIG. 5 is a block diagram of a redundancy power switch.

Referring now to FIG. 5 a block diagram of a redundancy power switch is shown. The example of FIG. 5 is meant only to be an example on how the power switch 40 of FIG. 4 may be implemented. One skilled in the art may create many variations to make use of the common connection provided by Y-cable 18 to provide needed power to a failed line via power switch 40. Both active line 14 and standby line 16 utilize the power switch 40 shown in FIG. 5 and are connected through the same Y-cable 18, which also carries data. When 12V power is present in active line 14 and the on/off control 50 for the card containing active line 14 is in the on position, then 3.3V Low DropOut voltage regulator (LDO) 52 is disabled and 3.3V DC/DC 54 is enabled to provide analog 10 power to the LIU's via line 56. In this state MOSFET 58 is in the on state providing 3.3V digital power to the active line via digital 3.3V connection 59.

If 12V power fails or during startup when On/Off control 50 is in the off state, then 3.3V DC/DC 54 is off, MOSFET 58 is off and the analog power to IO is delivered via line 60 from LDO 52. LDO 52 is a low power device and enabled only when 12V power is disabled to maintain the LIU in a high impededance state.

Feature 62 provides surge protection, feature 64 provides current backflow protection and feature 66 is a current limiting resistor.

One example of an embodiment of the invention is shown in FIG. 5. In the example shown, LDO 52 is a low power redundancy device. MOSFET 58 acts as a switch to disconnect power from components within active line 14.

This invention is applicable to interfaces with high density connectors where pins are available for redundant power and this power can be used for all such interfaces.

Although the invention has been described with reference to certain specific embodiments, various modifications thereof will be apparent to those skilled in the art without departing from the spirit and scope of the invention as outlined in the claims appended hereto.

I claim:

1. A system for providing power to a failing line in a communication device, said system comprising:
    a connector between an active line and a standby line, said connector further connected to a communications line; and
    a power switch, said power switch providing power to said active line via said connector despite failure of primary power to said active line by drawing power from said standby line to said active line through said connector;
    wherein said power switch comprises a low power redundancy device and a switch to disconnect power, said device and said switch to disconnect power operatively connected to each other;
    wherein said low power redundancy device is a Low DropOut voltage regulator (LDO) and said switch to disconnect power is a MOSFET.

2. The system of claim 1 wherein said connector is a Y-cable.

3. The system of claim 1 wherein said device and said switch to disconnect power are connected by a 3.3V DC/DC device.

4. A method for providing power to a failing line in a communication device, said method comprising the steps of:
    connecting an active line and a standby line, via a communications line;
    providing power to said active line via said communication line despite failure of primary power to said active line by drawing power from said standby line to said active line through said communication line;
    wherein the step of providing power utilizes a low power redundancy device and a switch to disconnect power; and
    utilizing a Low DropOut voltage regulator (LDO) as the low power redundancy device and the MOSFET as a switch to disconnect power.

5. The method of claim 4 wherein the step of connecting utilizes a Y-cable.

6. The method of claim 4 further comprising the step of utilizing a 3.3V DC/DC device to connect said low power redundancy device to said switch to disconnect power.

7. A system for providing power to a failing line in a communication device, said system comprising:
    means for connecting an active line and a standby line, via a communications line; and
    means for providing a power switch, said power switch providing power to said active line via said communications line despite failure of primary power to said active line by drawing power from said standby line to said active line through said communication line;
    wherein said means for providing a power switch comprises a low power redundancy device and a switch to disconnect power, said device and said switch to disconnect power operatively connected to each other;
    wherein said low power redundancy device is a Low DropOut voltage regulator (LDO) and said switch to disconnect power is a MOSFET.

8. The system of claim 7 wherein said means for connecting comprises a Y-cable,

9. The system of claim 7 wherein said device and said switch are connected by a 3.3V DC/DC device.

* * * * *